(12) United States Patent
Liao

(10) Patent No.: US 12,463,006 B2
(45) Date of Patent: Nov. 4, 2025

(54) TRANSMISSION ELECTRON MICROSCOPE HIGH-RESOLUTION IN SITU FLUID FREEZING CHIP

(71) Applicant: XIAMEN UNIVERSITY, Fujian (CN)

(72) Inventor: Honggang Liao, Fujian (CN)

(73) Assignee: XIAMEN UNIVERSITY, Fujian (CN)

( * ) Notice: Subject to any disclaimer, the term of this patent is extended or adjusted under 35 U.S.C. 154(b) by 422 days.

(21) Appl. No.: 18/020,876

(22) PCT Filed: Aug. 11, 2020

(86) PCT No.: PCT/CN2020/108322
§ 371 (c)(1),
(2) Date: Feb. 13, 2023

(87) PCT Pub. No.: WO2022/032463
PCT Pub. Date: Feb. 17, 2022

(65) Prior Publication Data
US 2023/0326712 A1    Oct. 12, 2023

(51) Int. Cl.
| | |
|---|---|
| H01J 37/26 | (2006.01) |
| G01N 23/04 | (2018.01) |
| H01J 37/20 | (2006.01) |
| H01L 23/38 | (2006.01) |
| H10N 10/82 | (2023.01) |
| H10N 10/851 | (2023.01) |
| H10N 10/852 | (2023.01) |

(52) U.S. Cl.
CPC .............. *H01J 37/26* (2013.01); *G01N 23/04* (2013.01); *H01J 37/20* (2013.01); *H01L 23/38* (2013.01); *H10N 10/82* (2023.02); *H10N 10/852* (2023.02); *H10N 10/8556* (2023.02)

(58) Field of Classification Search
CPC ........ H01J 37/26; H01J 37/20; H10N 10/852; H10N 10/8556; H10N 10/82; G01N 23/04; H01L 23/38
See application file for complete search history.

(56) References Cited

U.S. PATENT DOCUMENTS

| | | | |
|---|---|---|---|
| 11,187,224 B2 * | 11/2021 | Xia | .................... B01L 3/502761 |
| 2017/0213692 A1 * | 7/2017 | Yu | .......................... G01N 23/02 |

FOREIGN PATENT DOCUMENTS

| | | |
|---|---|---|
| CN | 206535564 U | 10/2017 |
| CN | 110337706 A | 10/2019 |
| CN | 111370280 A | 7/2020 |
| WO | WO-2008010718 A2 | 1/2008 |

* cited by examiner

*Primary Examiner* — Nicole M Ippolito
(74) *Attorney, Agent, or Firm* — Cooper Legal Group, LLC

(57) ABSTRACT

A transmission electron microscope high-resolution in situ fluid freezing chip includes a lower chip and an upper chip. The lower chip is provided with a support layer, a freezing layer, an insulating layer, an opening, and a center window. The freezing layer is provided with contact electrodes, semiconductor films, and a conductive metal film. The center window is surrounded by the conductive metal film; the contact electrodes are disposed at an edge of the chip. One ends of the semiconductor films are lapped on the conductive metal film, and the other ends are lapped on the electrodes. In the outer edge of the conductive metal film, silicon is etched to form the opening. The support layer covers the opening. The conductive metal film is disposed on the support layer. A plurality of holes are provided in the center window.

15 Claims, 8 Drawing Sheets

TRANSMISSION ELECTRON MICROSCOPE HIGH-RESOLUTION IN SITU FLUID FREEZING CHIP

TECHNICAL FIELD

The present disclosure relates to the field of chips, in particular to a transmission electron microscope high-resolution in situ fluid freezing chip.

BACKGROUND

The current in situ transmission electron microscopy provides a full dynamic gas-fluid environment, which on the one hand helps technicians capture more dynamic structural change information. However, on the other hand, due to the high-speed movement of molecules, it is difficult for technicians to capture some important instantaneous information with high resolution in the dynamic process, such as the change of element valence state and molecular structure during chemical reaction, ion distribution in an electric double layer at an electrochemical solid-liquid interface, the change of the three-dimensional structure of biomolecules (such as antigens/antibodies) when interacting. The instantaneous chemical state and spatial distribution information in these process information are very necessary for technicians to interpret reaction principles from the molecular and atomic scales, and the characterization of these information requires an invariable state for a long time, which may not be achieved by current cryo-electron microscopes and in situ fluid transmission electron microscopes. In order to obtain these information, technicians need to perform micro-area rapid freezing during in situ testing in combination with high-resolution STEM/EDS/EELES characterization.

SUMMARY

The objective of the present disclosure is to provide a transmission electron microscope high-resolution in situ fluid freezing chip which is capable of carrying out micro-area rapid freezing during in situ testing. At the same time, the chip further has the advantages of micro-area rapid freezing, high resolution and low sample drift rate.

In order to achieve the above objective, the present disclosure provides a transmission electron microscope high-resolution in situ fluid freezing chip. The transmission electron microscope high-resolution in situ fluid freezing chip includes an upper chip and a lower chip combined via a metal bonding layer, the upper chip and the lower chip each include a front side and a back side, the front side of the upper chip is directly bonded to the front side of the lower chip via the metal bonding layer to define an ultra-thin chamber, the upper chip and the lower chip are each made of a silicon substrate with silicon nitride or silicon oxide on two sides, and the upper chip is provided with two injection ports and a first center window; the lower chip is provided with a support layer, a freezing layer, an insulating layer, an opening, and a second center window; the freezing layer is provided with three contact electrodes, six pairs of semiconductor films, and a conductive metal film; the second center window is surrounded by the conductive metal film, and serves as a center of the conductive metal film; the three contact electrodes are disposed at an edge of the lower chip; one ends of the six pairs of semiconductor films are lapped on the conductive metal film, and the other ends of the six pairs of semiconductor films are lapped on the electrodes; in a region with the second center window as a center and beyond an outer edge of the conductive metal film, silicon is etched to form the opening, and the support layer covers the opening; the conductive metal film is disposed on a portion, above the opening, of the support layer; a portion, except a portion with the contact electrodes, of the freezing layer is covered with the insulating layer; and an area of the upper chip is slightly smaller than an area of the lower chip, the first center window of the upper chip is aligned with the second center window of the lower chip, and a plurality of holes are provided in the first center window and the second center window.

Further, an external dimension of the lower chip is 2 mm*2 mm-10 mm*10 mm. Preferably, the external dimension of the lower chip is 4 mm*8 mm.

Optionally, a thickness of the metal bonding layer is 50 nm-2000 nm; and the metal bonding layer is made of a low-melting-point metal. Preferably, the metal bonding layer is made of In, Sn or Al.

Optionally, a thickness of the silicon nitride or silicon oxide is 5-200 nm.

Optionally, a thickness of the silicon substrates is 50-500 μm.

The first center window of the upper chip is located in a center of the upper chip, and the two injection ports are arranged symmetrically with respect to the first center window.

Further, the support layer is made of silicon nitride or silicon oxide with a thickness of 0.5-5 μm.

Further, in the freezing layer, two of the three contact electrodes serve as an input current of a positive electrode, and the other one of the three contact electrodes serves as an output current of a negative electrode.

Optionally, the contact electrodes are made of gold, silver or copper with a thickness of 50 nm-300 nm; a positive electrode has a length of 1-1.5 mm and a width of 0.5-1.2 mm; and a negative electrode has a length of 1-1.5 mm and a width of 0.4-0.8 mm.

Optionally, the six pairs of semiconductor films include six n-type semiconductor films and six p-type semiconductor films; the six n-type semiconductor films are L-shaped strips and are symmetrically disposed on an outer side of the lower chip in parallel; and the six p-type semiconductor films are regular rectangles and are disposed on an inner side of the lower chip in parallel. Preferably, n-type semiconductors in the n-type semiconductor films are n-type bismuth telluride, n-type silicon germanium, n-type lead telluride, n-type zinc telluride, or n-type bismuth selenide; and p-type semiconductors in the p-type semiconductor films are polysilicon, p-type bismuth telluride, p-type silicon germanium, or p-type antimony telluride.

Optionally, the semiconductor films have a length of 4-6 mm, a width of 0.4-0.8 mm, and a thickness of 50 nm-500 nm.

Further, the conductive metal film is a concentric square-shaped conductive metal film made of conductive metal, and the center of the conductive metal film is the second center window. Preferably, the conductive metal is gold, silver or copper with a thickness of 50 nm-300 nm.

A size of an outer square of the conductive metal film is 100 μm*100 μm-500 μm*500 μm, and a size of an inner square of the conductive metal film is 5 μm*5 μm-100 μm*100 μm.

Further, the insulating layer is a silicon nitride or silicon oxide layer with a thickness of 30-150 nm.

Further, the opening is a circular opening or a square opening. Preferably, a diameter of the circular opening is 200 µm-600 µm; and a size of the square opening is 200 µm*200 µm-800 µm*800 µm.

Optionally, the first center window and the second center window are square center windows. Preferably, a size of the square center windows is 5 µm*5 µm-100 µm*100 µm. More preferably, a size of the square center windows is 20 µm*50 µm.

Optionally, a size of the holes is 0.5 µm-5 µm.

The chip according to the present disclosure has a small temperature-controlled area (100 µm*100 µm-500 µm*500 µm) and has the design of heat insulation treatment, such that the heat transfer is small, and micro-area rapid temperature control can be achieved.

DESCRIPTION OF EMBODIMENTS

Figure 1:
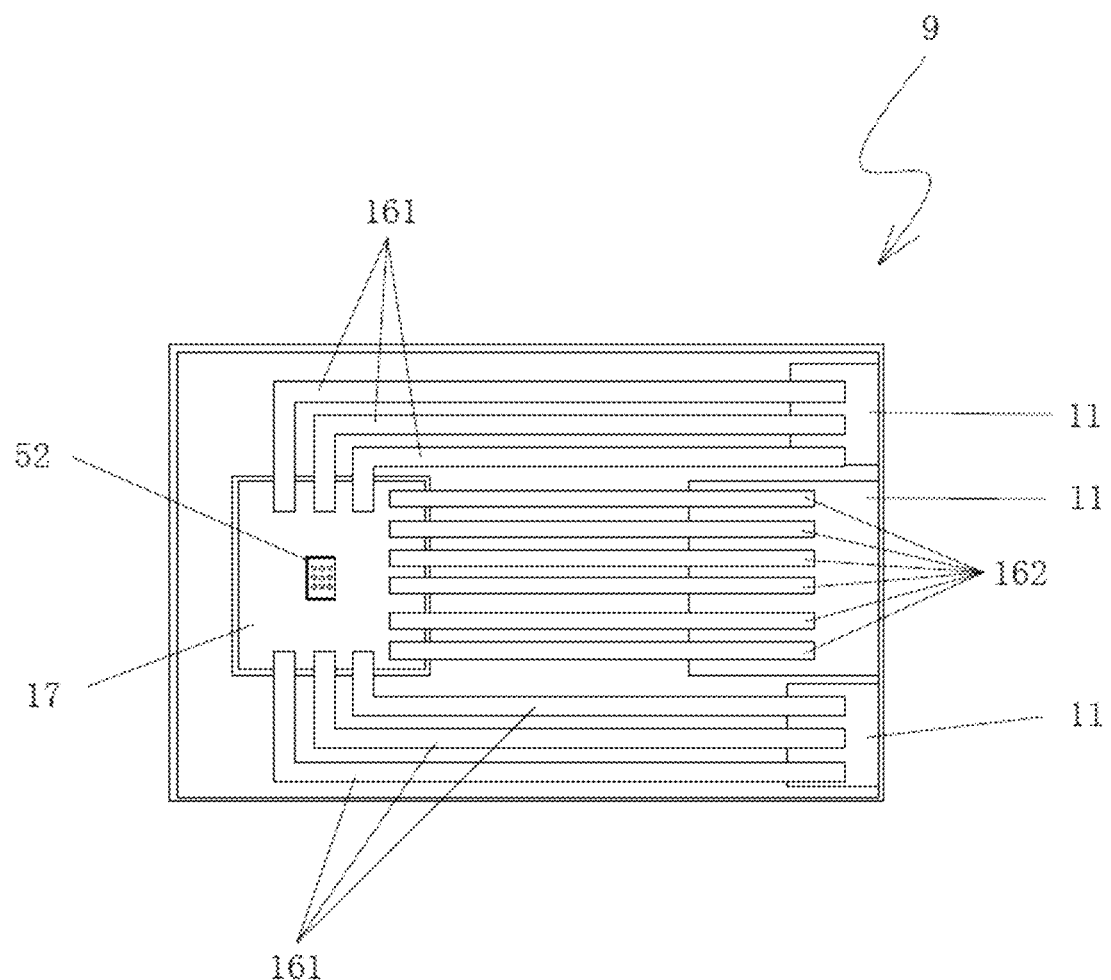
FIG. 1 is a schematic structural diagram of a freezing layer of a lower chip of a chip according to the present disclosure.
Figure 2:
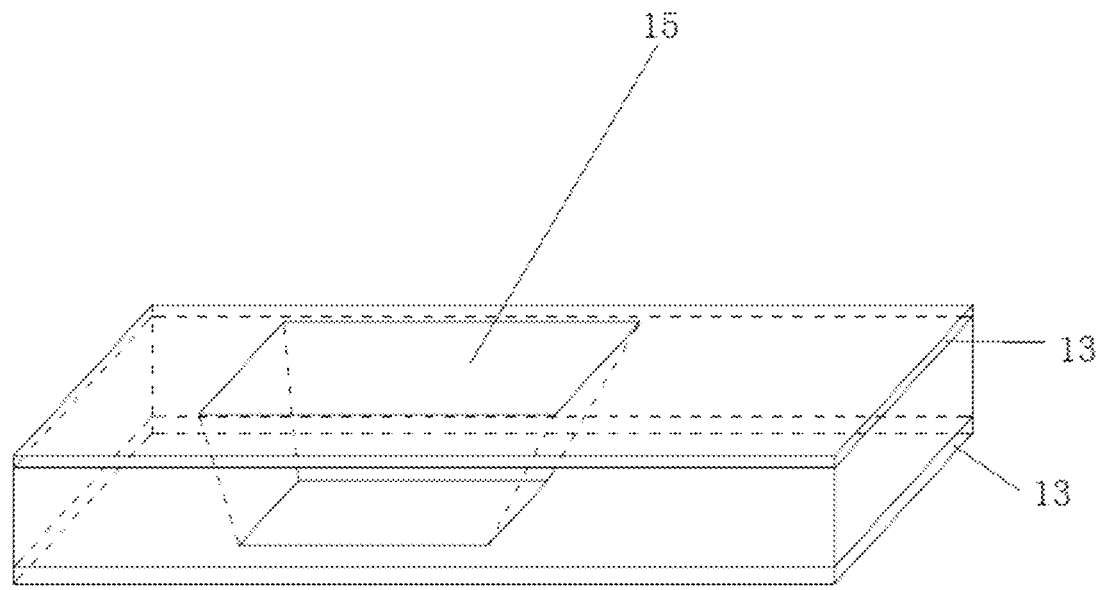
FIG. 2 is a schematic structural diagram after etching of an opening during preparation of a lower chip of a chip according to the present disclosure.
Figure 3:
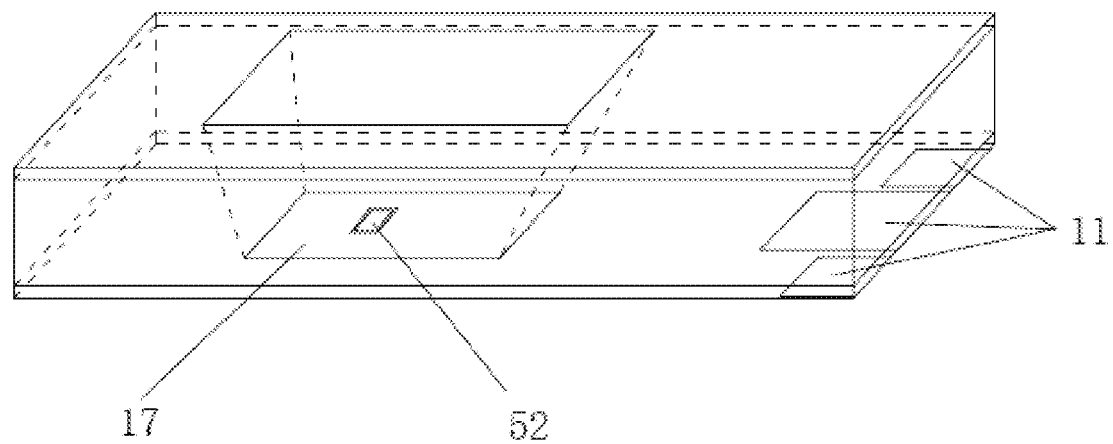
FIG. 3 is a schematic structural diagram after etching of an opening and coating of a conductive metal film and contact electrodes during preparation of a lower chip of a chip according to the present disclosure.
Figure 4:
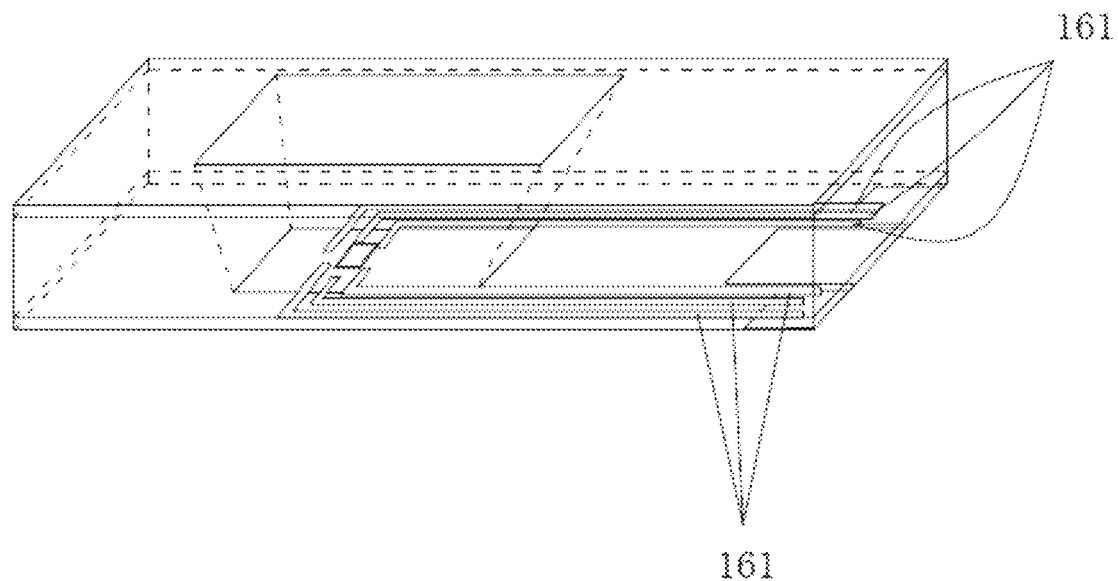
FIG. 4 is a schematic structural diagram after coating of n-type semiconductor films on the basis of FIG. 3.
Figure 5:
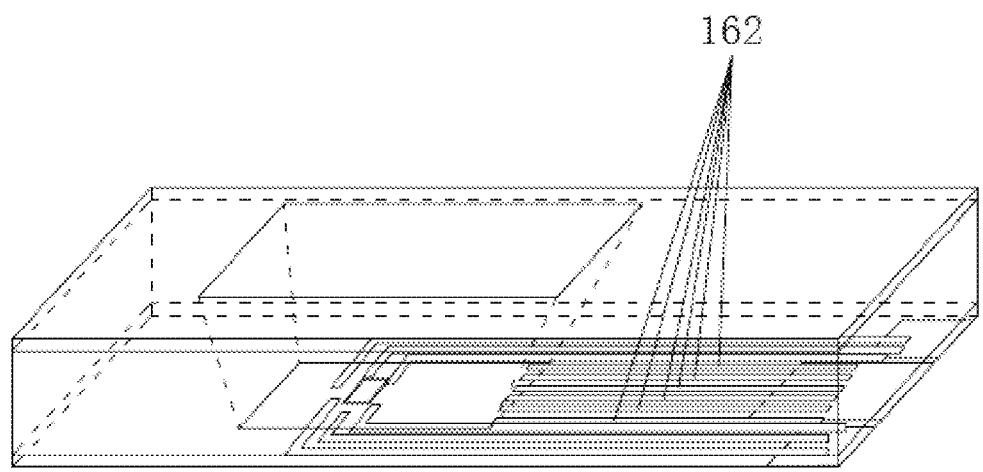
FIG. 5 is a schematic structural diagram after coating of p-type semiconductor films on the basis of FIG. 4.
Figure 6:
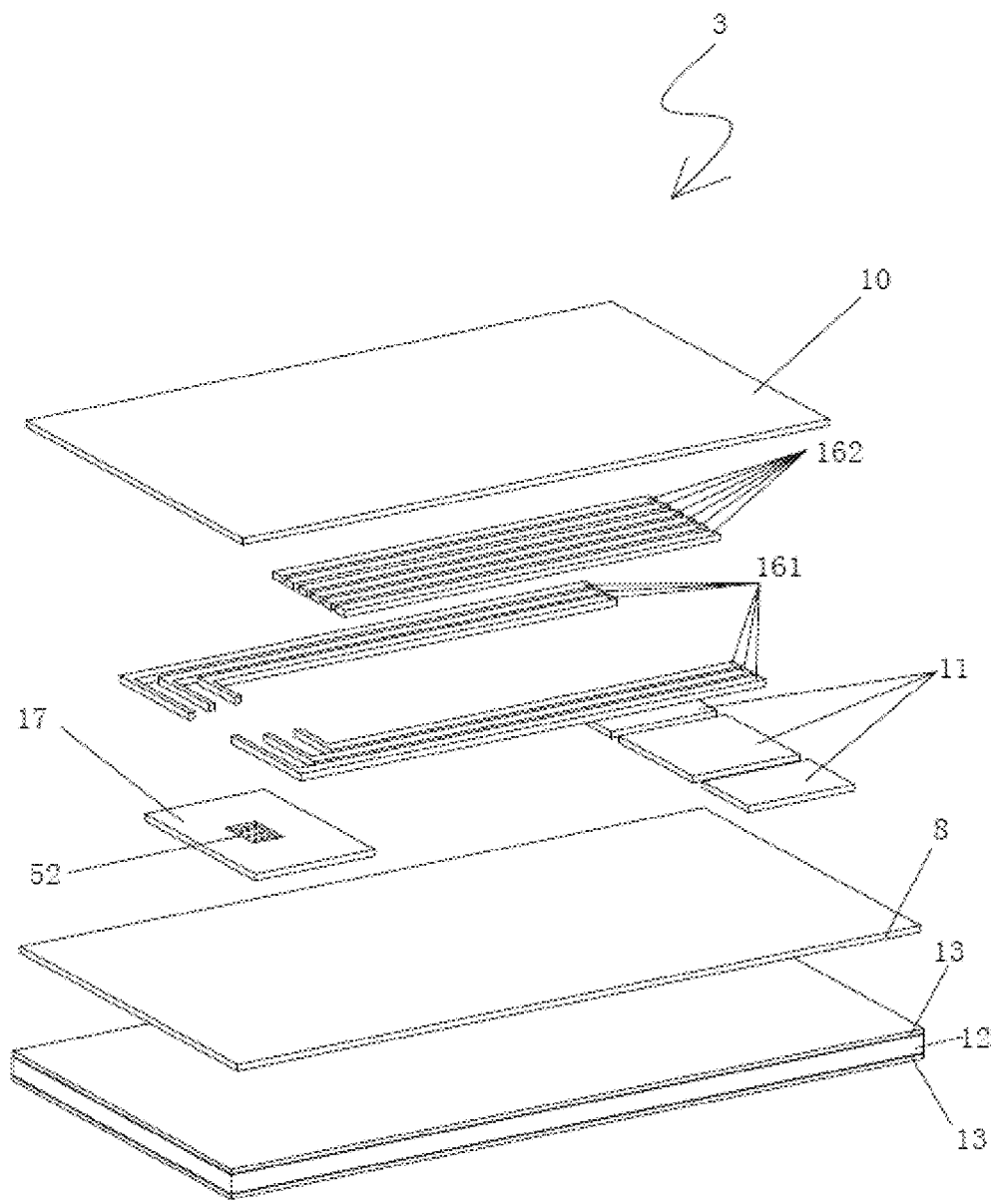
FIG. 6 is a schematic structural diagram of a lower chip of a chip according to the present disclosure.
Figure 7:
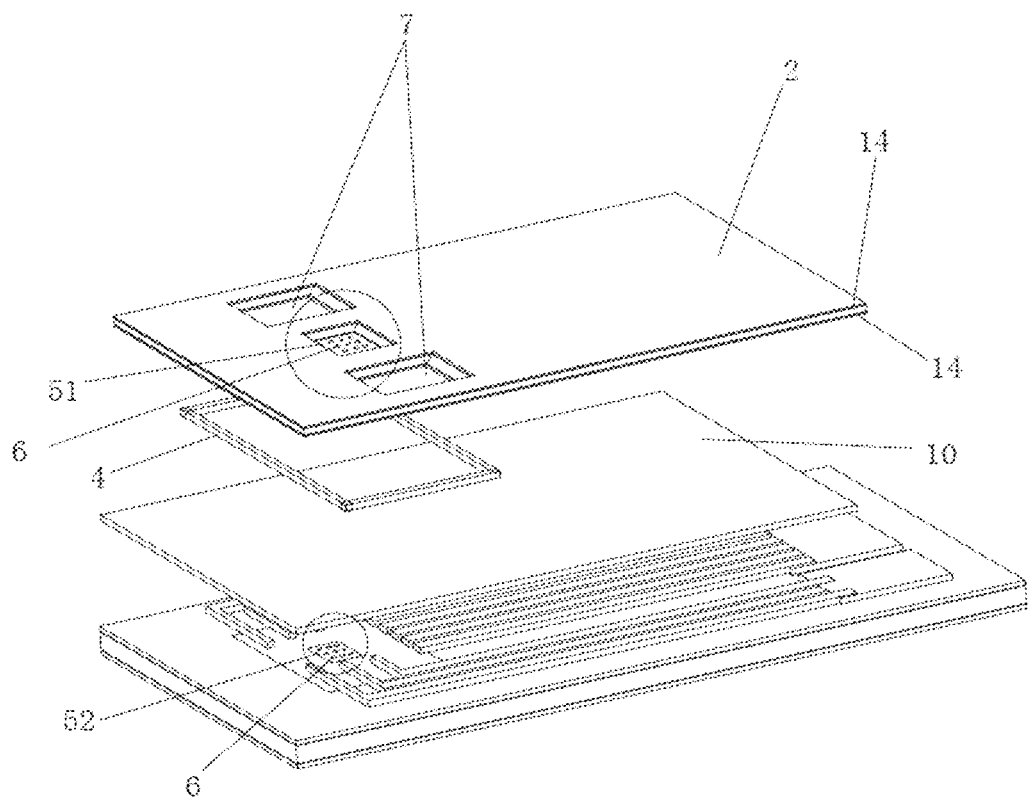
FIG. 7 is a schematic structural diagram before combination of an upper chip and a lower chip of a chip according to the present disclosure.
Figure 8:
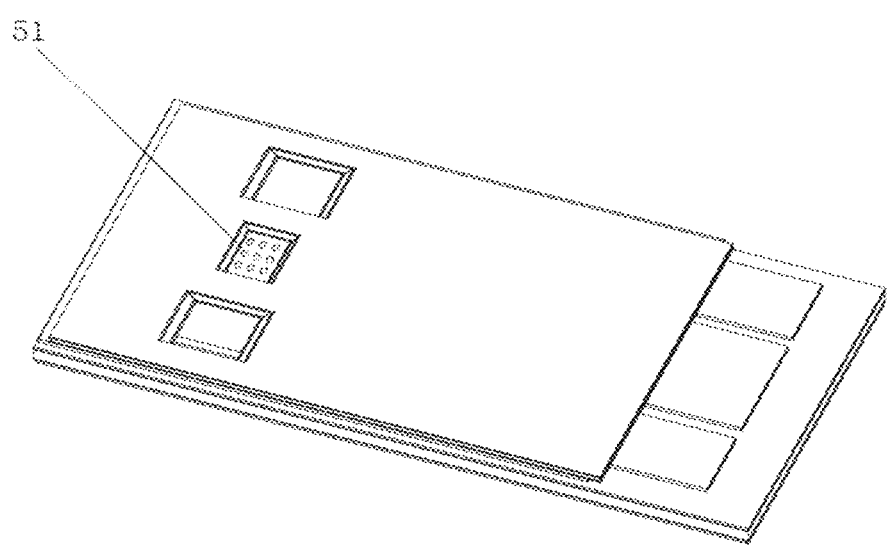
FIG. 8 is a schematic structural diagram after combination of an upper chip and a lower chip of a chip according to the present disclosure.
Figure 9:
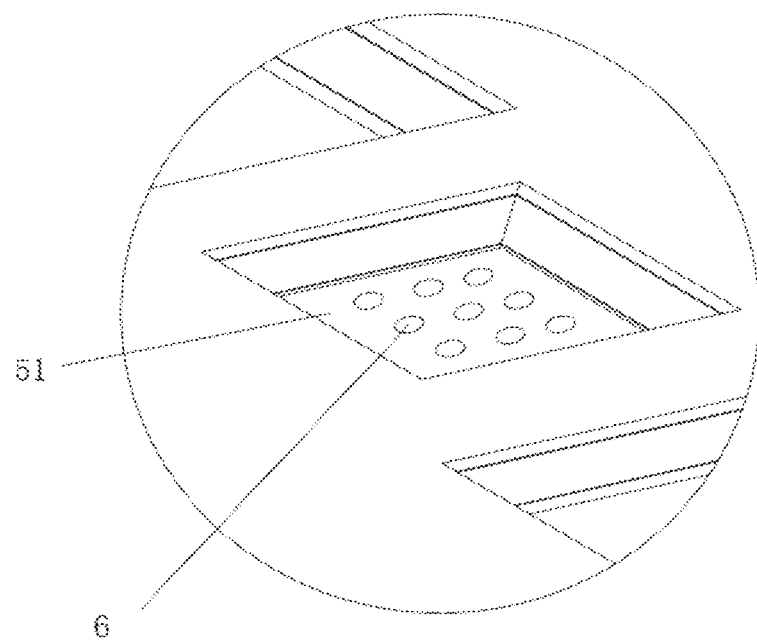
FIG. 9 is an enlarged view of a first center window 51.
Figure 10:
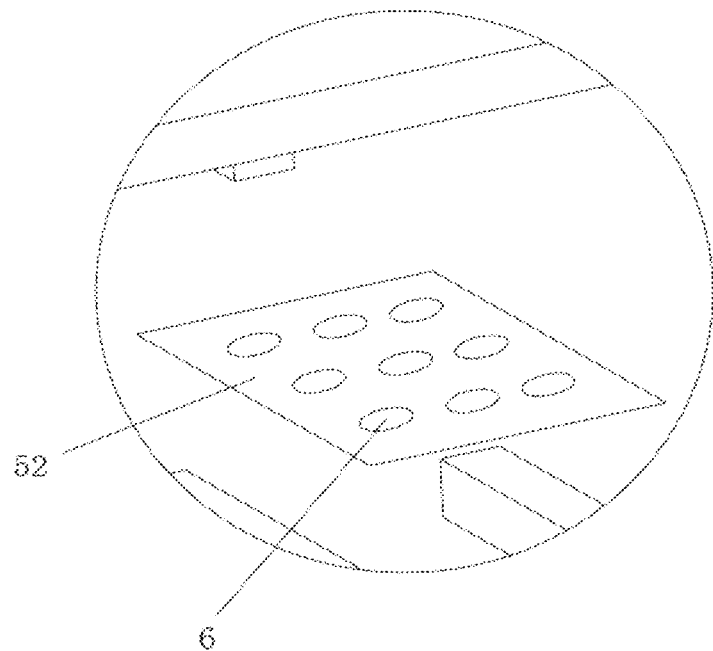
FIG. 10 is an enlarged view of a second center window 52.

The embodiments of the present disclosure will be described below in detail, examples of which are illustrated in the accompanying drawings. The same or similar reference numerals refer to the same or similar elements or elements having the same or similar functions throughout. The embodiments described below with reference to the accompanying drawings are exemplary, and are intended to be illustrative of the present disclosure and should not be construed as limiting the present disclosure. Where specific technology or conditions are not indicated in the embodiments, the technology or conditions described in the literature in the field or in the product specification shall be followed. Reagents or instruments used without a manufacturer's indication are conventional products that may be obtained commercially.

A chip is prepared as follows according to the structures in FIG. 1 to FIG. 10, where 1 denotes a transmission electron microscope high-resolution in situ fluid freezing chip; 2 denotes an upper chip; 3 denotes a lower chip; 4 denotes a metal bonding layer; 5 denotes center windows; 51 denotes a center window of the upper chip; 52 denotes a center window of the lower chip; 6 denotes holes; 7 denotes injection ports; 8 denotes a support layer; 9 denotes a freezing layer; 10 denotes an insulating layer; 11 denotes three contact electrodes; 12 denotes silicon substrates; 13 and 14 denote silicon nitride or silicon oxide layers; 15 denotes an opening; 161 denotes n-type semiconductor films; 162 denotes p-type semiconductor films; and 17 denotes a conductive metal film.

Example 1: Preparation of a Transmission Electron Microscope High-Resolution In Situ Fluid Freezing Chip A preparation method of an upper chip includes:

S1. Transfer a pattern of a center window from a photolithography mask to an Si(100) wafer A with silicon nitride or silicon oxide layers on two sides by using a photolithography process, and then develop in a positive photoresist developer to obtain a wafer A-1.

Preferably, the photolithography process refers to exposure in a hard contact mode of an ultraviolet photolithography machine; a thickness of the silicon nitride or silicon oxide layers is 5-200 nm; and the development time is 50 s.

More preferably, the exposure time is 15 s.

S2. Etch the silicon nitride layer on the front side of the wafer A-1 by using a reactive ion etching process to obtain the center window, then soak the wafer A-1 in acetone with the front side thereof facing upwards, and finally rinse the wafer with a large amount of deionized water to remove photoresist, so as to obtain a wafer A-2.

S3. Transfer a pattern of holes in the center window from the photolithography mask to the front side of the wafer A-2 by using an ultraviolet laser direct writing process, then develop in the positive photoresist developer, and rinse a surface with deionized water to obtain a wafer A-3.

Preferably, the development time is 50 s.

S4. Etch silicon nitride at the holes in the back side of the wafer A-3 by using the reactive ion etching process until reaching a thickness of 10 nm-15 nm, then successively soak the wafer A-3 in acetone with the front side thereof facing upwards, and finally rinse the wafer with acetone to remove photoresist, so as to obtain a wafer A-4.

Preferably, a size of the holes is 0.5 µm-5 µm.

S5. Place the wafer A-4 into a potassium hydroxide solution for wet etching with the back side thereof facing upwards, end etching until only a film window is reserved in the front side, take out the wafer A-4, and rinsing the wafer with a large amount of deionized water to obtain a wafer A-5.

Preferably, the mass percentage concentration of the potassium hydroxide solution is 20%; and the etching temperature is 80° C., and the etching time is 1.5-4 h.

More preferably, the etching time is 2 h.

S6. Transfer a pattern of a bonding layer from the photolithography mask to the front side of the wafer A-5 by using the photolithography process, then develop in the positive photoresist developer, and rinse the surface with deionized water to obtain a wafer A-6.

Preferably, the photolithography process refers to exposure in the hard contact mode of the ultraviolet photolithography machine; and the development time is 50 s.

More preferably, the exposure time is 15 s.

S7. Evaporate a metal bonding material on the wafer A-6 by using a thermal evaporation coating process to form a metal bonding layer, so as to obtain a wafer A-7.

Preferably, a low-melting-point metal is adopted; and a thickness of the metal bonding layer is 50-2000 nm.

More preferably, the metal is In, Sn or Al.

S8. Perform laser scribing on the wafer A-7 to obtain an independent chip, that is, the upper chip.

A preparation method of a lower chip includes:

S1. Prepare an Si(100) wafer B with silicon nitride or silicon oxide layers on two sides. The thickness of the silicon nitride or silicon oxide layers is 5-200 nm.

S2. Transfer a pattern of a conductive metal carrier film surrounding a center window from a photolithography mask to the back side of the wafer by using a photolithography process, then develop in a positive photoresist developer, and clean a surface with deionized water to obtain a wafer B-1.

Preferably, the photolithography process refers to exposure in a hard contact mode of an ultraviolet photolithography machine; photoresist adopted in the photolithography process is AZ5214E; and the development time is 65 s.

More preferably, the exposure time is 20 s.

S3. Etch away silicon nitride or silicon oxide, corresponding to conductive metal, on the silicon nitride layer on the back side of the wafer B-1 by using a reactive ion etching process, then successively soak the wafer in acetone with the back side thereof facing upwards, and finally rinse the wafer with acetone to remove photoresist, so as to obtain a wafer B-2.

Preferably, a size of an outer square of the conductive metal film is 100 μm*100 μm-500 μm*500 μm, and a size of an inner square of the conductive metal film is 5 μm*5 μm-100 μm*100 μm.

S4. Grow silicon oxide or silicon nitride on a front side of an etched silicon substrate of the wafer B-2 by using a PECVD process to obtain a wafer B-3.

Preferably, the thickness of the silicon oxide or silicon nitride is 0.5-5 μm.

S5. Transfer a pattern of a metal film and a pattern of contact electrodes from the photolithography mask to the front side of the wafer B-3 by using the photolithography process, then develop in the positive photoresist developer, and rinse a surface with deionized water to obtain a wafer B-4.

S6. Sputter the metal film on the front side of the wafer B-4 by using DC magnetron sputtering, then successively soak the wafer B-4 in acetone with the front side thereof facing upwards for stripping, and finally rinse the wafer with deionized water to remove photoresist and reserve the metal film, so as to obtain a wafer B-5.

Preferably, the metal film is made of gold, silver or copper, with the thickness of 50 nm-300 nm.

S7. Transfer a pattern of n-type semiconductors from the photolithography mask to the front side of the wafer B-5 by using the photolithography process, then develop in the positive photoresist developer, and rinse the surface with deionized water to obtain a wafer B-6.

S8. Sputter a layer of n-type semiconductor films on the front side of the wafer B-6 by using RF magnetron sputtering, then successively soak the wafer B-6 in acetone with the front side thereof facing upwards for stripping, and finally rinse the wafer with deionized water to remove photoresist and reserve the n-type semiconductor films, so as to obtain a wafer B-7.

Preferably, the n-type semiconductors in the n-type semiconductor films are n-type bismuth telluride, n-type silicon germanium, n-type lead telluride, n-type zinc telluride, or n-type bismuth selenide.

S9. Transfer a pattern of p-type semiconductors from the photolithography mask to the front side of the wafer B-7 by using the photolithography process, then develop in the positive photoresist developer, and rinse the surface with deionized water to obtain a wafer B-8.

Preferably, the p-type semiconductors are polysilicon, p-type bismuth telluride, p-type silicon germanium, or p-type antimony telluride.

S10. Sputter a layer of p-type semiconductor films on the front side of the wafer B-8 by using RF magnetron sputtering, then successively soak the wafer B-8 in acetone with the front side thereof facing upwards for stripping, and finally rinse the wafer with deionized water to remove photoresist and reserve the p-type semiconductor films, so as to obtain a wafer B-9.

Preferably, p-type semiconductors in the p-type semiconductor films are polysilicon, p-type bismuth telluride, p-type silicon germanium, or p-type antimony telluride.

S11. Grow a silicon nitride or silicon oxide or aluminum oxide layer on the semiconductor films of the wafer B-9 by using the PECVD process as an insulating layer, so as to obtain a wafer B-10.

Preferably, a thickness of the insulating layer is 30-150 nm.

S12. Transfer a pattern of holes in the center window from the photolithography mask to the front side of the wafer B-10 by using an ultraviolet laser direct writing photolithography process, then develop in the positive photoresist developer, and rinse the surface with deionized water to obtain a wafer B-11.

Preferably, photoresist adopted in the ultraviolet laser direct writing process is AZ5214E, and the output power is 260 W/μs.

S13. Etch silicon nitride or silicon oxide at the holes in the back side of the wafer B-11 by using the reactive ion etching process, then soak the wafer B-11 in acetone with the front side thereof facing upwards, and finally rinse the wafer with acetone to remove photoresist, so as to obtain a wafer B-12.

Preferably, the size of the holes is 0.5 μm-5 μm.

S14. Perform laser scribing on the wafer B-12 to obtain an independent chip, that is, the lower chip.

Assembling: assemble the obtained upper chip and lower chip under a microscope, with the center windows of the upper chip and the lower chip aligned.

Figure 11:
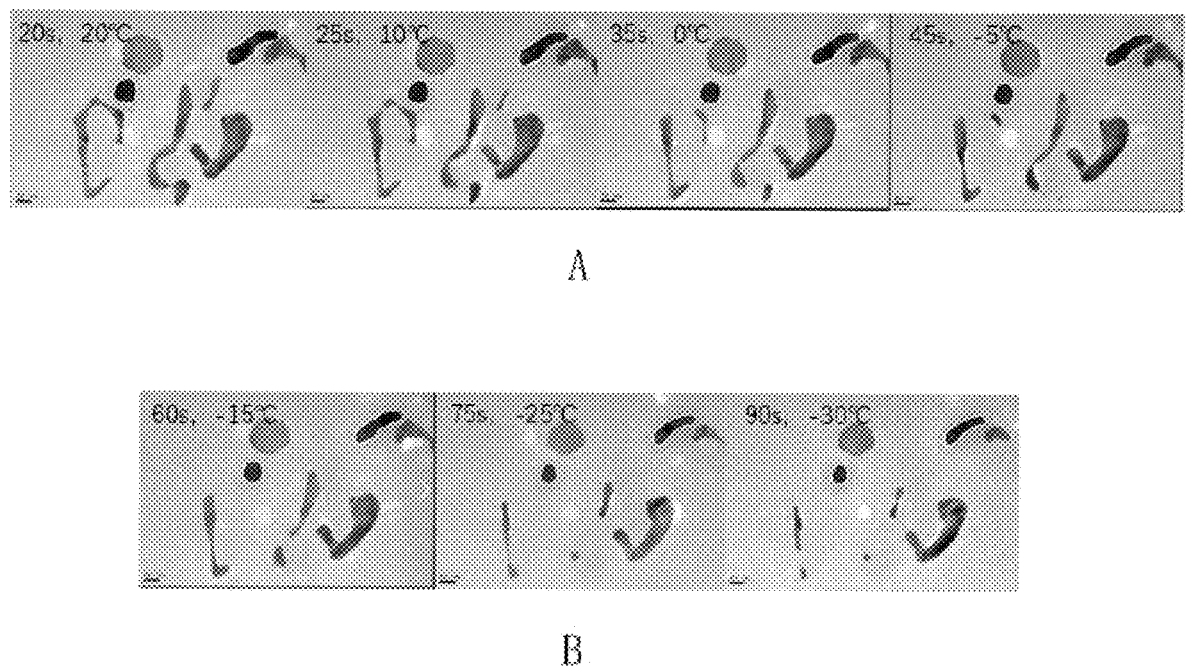
FIG. 11 is an electron microscope image of a sample observed using a chip according to the present disclosure.

Example 2: Use of a Transmission Electron Microscope High-Resolution In Situ Fluid Freezing Chip A super-saturated aqueous solution of calcium hydroxide (containing a trace amount of calcium hydroxide particles) was injected into injection ports of the transmission electron microscope high-resolution in situ fluid freezing chip prepared in Example 1, and the temperature of the chip was set to −30° C. by an external temperature control device in combination with temperature control software, so as to obtain an electron microscope image in FIG. 11. It is observed from A and B in FIG. 11 that during temperature reduction, nanoparticles become smaller as the solubility of solute increases. In this process, the morphology and contour of particles are clear, indicating that the chip has a high imaging resolution in an electron microscope. At the same time, a sample does not shift throughout the shooting, indicating that the chip has good stability and low sample drift rate during the experiment.

Example 3: Standard Time-Temperature Curve

Figure 12:
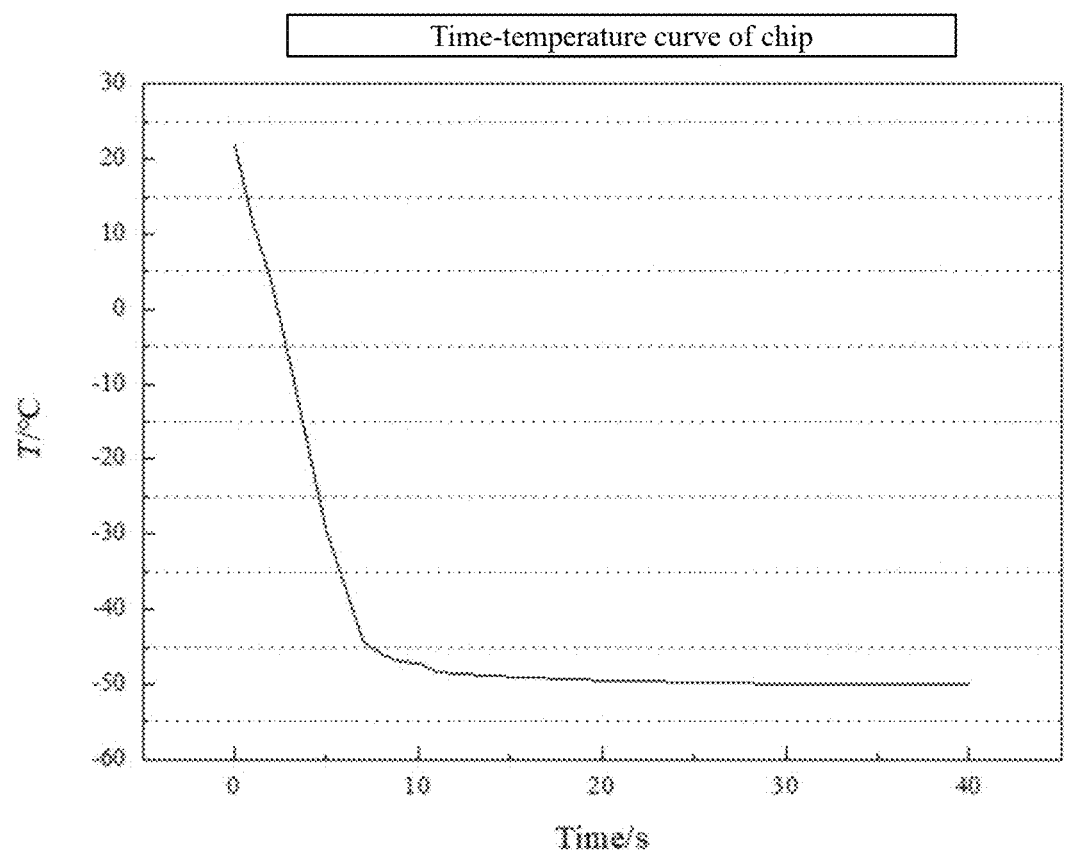
FIG. 12 is a standard time-temperature curve obtained using a chip according to the present disclosure.

The transmission electron microscope high-resolution in situ fluid freezing chip was measured by a thermometer before use to determine temperatures reached by cooling the chip at different output powers, so as to obtain a standard time-temperature curve, and then precise temperature control was achieved by precisely regulating the output power of a power supply device. Results are shown in FIG. 12. As may be seen from the line graph in FIG. 12, the temperature difference reaches 70° C. within 5-6 s, and the cooling rate is high. In addition, the temperature may be stabilized at −50° C. for a long time, indicating that the temperature control precision is high and that the chip according to the present disclosure has a large temperature control range, from low temperature to high temperature.

Although the embodiments of the present disclosure have been shown and described above, it can be understood that the above embodiments are illustrative and not restrictive, and that changes, modifications, substitutions and variations can be made by those skilled in the art without departing from the principles and spirit of the present disclosure.

The invention claimed is:

1. A transmission electron microscope high-resolution in situ fluid freezing chip, comprising an upper chip and a lower chip combined via a metal bonding layer, the upper chip and the lower chip each comprising a front side and a back side, the front side of the upper chip being directly bonded to the front side of the lower chip via the metal bonding layer to define an ultra-thin chamber, the upper chip and the lower chip being each made of a silicon substrate with silicon nitride or silicon oxide on two sides, the upper chip being provided with two injection ports and a first center window, wherein the lower chip is provided with a support layer, a freezing layer, an insulating layer, an opening, and a second center window; the freezing layer is provided with three contact electrodes, six pairs of semiconductor films, and a conductive metal film; the second center window is surrounded by the conductive metal film, and serves as a center of the conductive metal film; the three contact electrodes are disposed at an edge of the lower chip; one ends of the six pairs of semiconductor films are lapped on the conductive metal film, and the other ends of the six pairs of semiconductor films are lapped on the electrodes; in a region with the second center window as a center and beyond an outer edge of the conductive metal film, silicon is etched to form the opening, and the support layer covers the opening; the conductive metal film is disposed on a portion, above the opening, of the support layer; a portion, except a portion with the contact electrodes, of the freezing layer is covered with the insulating layer; and an area of the upper chip is slightly smaller than an area of the lower chip, the first center window of the upper chip is aligned with the second center window of the lower chip, and a plurality of holes are provided in the first center window and the second center window.

2. The transmission electron microscope high-resolution in situ fluid freezing chip according to claim 1, wherein an external dimension of the lower chip is 2 mm*2 mm-10 mm*10 mm.

3. The transmission electron microscope high-resolution in situ fluid freezing chip according to claim 1, wherein a thickness of the metal bonding layer is 50 nm-2000 nm; and the metal bonding layer is made of a low-melting-point metal.

4. The transmission electron microscope high-resolution in situ fluid freezing chip according to claim 1, wherein the metal bonding layer is made of In, Sn or Al.

5. The transmission electron microscope high-resolution in situ fluid freezing chip according to claim 1, wherein a thickness of the silicon substrates is 50-500 μm.

6. The transmission electron microscope high-resolution in situ fluid freezing chip according to claim 1, wherein the first center window of the upper chip is located in a center of the upper chip, and the two injection ports are arranged symmetrically with respect to the first center window.

7. The transmission electron microscope high-resolution in situ fluid freezing chip according to claim 1, wherein in the freezing layer, two of the three contact electrodes serve as an input current of a positive electrode, and the other one of the three contact electrodes serves as an output current of a negative electrode.

8. The transmission electron microscope high-resolution in situ fluid freezing chip according to claim 1, wherein the contact electrodes are made of gold, silver or copper.

9. The transmission electron microscope high-resolution in situ fluid freezing chip according to claim 1, wherein the six pairs of semiconductor films are six n-type semiconductor films and six p-type semiconductor films; the six n-type semiconductor films are L-shaped strips and are symmetrically disposed on an outer side of the lower chip in parallel; and the six p-type semiconductor films are regular rectangles and are disposed on an inner side of the lower chip in parallel.

10. The transmission electron microscope high-resolution in situ fluid freezing chip according to claim 9, wherein n-type semiconductors in the n-type semiconductor films are n-type bismuth telluride, n-type silicon germanium, n-type lead telluride, n-type zinc telluride, or n-type bismuth selenide; and p-type semiconductors in the p-type semiconductor films are polysilicon, p-type bismuth telluride, p-type silicon germanium, or p-type antimony telluride.

11. The transmission electron microscope high-resolution in situ fluid freezing chip according to claim 1, wherein the conductive metal film is a concentric square-shaped conductive metal film made of conductive metal, and the center of the conductive metal film is the second center window.

12. The transmission electron microscope high-resolution in situ fluid freezing chip according to claim 11, wherein the conductive metal is gold, silver or copper.

13. The transmission electron microscope high-resolution in situ fluid freezing chip according to claim 1, wherein the insulating layer is a silicon nitride or silicon oxide layer with a thickness of 30-150 nm.

14. The transmission electron microscope high-resolution in situ fluid freezing chip according to claim 1, wherein the opening is a circular opening or a square opening.

15. The transmission electron microscope high-resolution in situ fluid freezing chip according to claim 1, wherein the first center window and the second center window are square center windows.

* * * * *